(12) United States Patent
Kuo

(10) Patent No.: US 7,971,007 B2
(45) Date of Patent: Jun. 28, 2011

(54) DOWNGRADE MEMORY APPARATUS, AND METHOD FOR ACCESSING A DOWNGRADE MEMORY

(75) Inventor: Wu-Chi Kuo, Hsin-Dien (TW)

(73) Assignee: Silicon Motion, Inc., Jhubei (TW)

( * ) Notice: Subject to any disclaimer, the term of this patent is extended or adjusted under 35 U.S.C. 154(b) by 428 days.

(21) Appl. No.: 12/168,955

(22) Filed: Jul. 8, 2008

(65) Prior Publication Data

US 2010/0011173 A1 Jan. 14, 2010

(51) Int. Cl.
*G06F 12/00* (2006.01)
(52) U.S. Cl. .. 711/156; 711/155; 711/209; 711/E12.059
(58) Field of Classification Search .................. None
See application file for complete search history.

(56) References Cited

U.S. PATENT DOCUMENTS 6,446,177 B1 * 9/2002 Tanaka et al. ................ 711/163

OTHER PUBLICATIONS

Office Action from corresponding Chinese Application No. 2008101767814 dated Jan. 19, 2011. English machine translation attached.

* cited by examiner

*Primary Examiner* — Reginald G Bragdon
*Assistant Examiner* — Thanh D Vo
(74) *Attorney, Agent, or Firm* — Grossman, Tucker, Perreault & Pfleger, PLLC

(57) ABSTRACT

A method for accessing a downgrade memory and a downgrade memory apparatus are provided. The downgrade memory apparatus comprises at least one management unit and a controller. The management unit comprises a plurality of blocks, each block having a plurality of pages, and each page having a plurality of sectors, the downgrade memory having a plurality of non-accessible sectors. The controller is configured to parse a write command corresponding to a special block, to select at least one accessible sector according to a status information of the special block and to program the write command to the special block, wherein the status information indicates at least one non-accessible sector in the special block. Thereby the method and the apparatus of downgrade memory may as well omit the non-accessible sectors as enhance the usage memory capacity in accordance with the status information.

11 Claims, 5 Drawing Sheets

DOWNGRADE MEMORY APPARATUS, AND METHOD FOR ACCESSING A DOWNGRADE MEMORY

CROSS-REFERENCES TO RELATED APPLICATIONS

Not applicable.

BACKGROUND OF THE INVENTION

1. Field of the Invention

The present invention relates to a downgrade memory apparatus and a method for accessing a downgrade memory. More particularly, the present invention relates to a downgrade memory apparatus capable of recording bad sectors in a block.

2. Descriptions of the Related Art

Usually, memories may have some defects during manufacturing. The defected memories would be sifted out from qualified memories during a quality control process, and are not applied in markets. However, the defected memory is still used well by a specific procedure. The defected memory may as well include some defects as be reused. Such memory is called a downgrade memory.

The aforementioned defects including defected blocks that cannot be accessed, defected connection between elements of the memory, and etc. Once a memory is determined as a downgrade memory during manufacturing, the downgrade memory may be dumped and the cost of products increases. However, some downgrade memories only have few defects and still good at most parts thereof. For example, a downgrade memory may be designed to have 1 Giga bits, but actually only has 600 Mega bits accessible space. Once the downgrade memory is dumped, then the 600 Mega bits accessible space is wasted.

Therefore, the memory industry is desired to utility the downgrade memory by enhancing accessible resource of the downgrade memory to achieve well use of the defected memories and to decrease production cost.

SUMMARY OF THE INVENTION

One aspect of this invention is to provide a method for accessing a downgrade memory. By marking bad sectors of the downgrade memory, and accessing the downgrade memory with specific commands, the downgrade memory can be accessed by a host, thus, downgrade memory is still acceptable as a usable memory. The method is applied in a downgrade memory including a plurality of blocks, each block having a plurality of pages, and each page having a plurality of sectors, the downgrade memory having a plurality of non-accessible sectors. The method comprises the steps of: programming an initial write command to the blocks; generating status information by programming an initial read command to the blocks after the blocks have been written; marking at least one block as a special block having at least one of the non-accessible sectors in response to the status information for a follow-up accessing, wherein the status information indicates the at least one of the non-accessible sectors of the at least one block.

Another aspect of this invention is to provide a method for accessing a downgrade memory. By marking bad sectors of the downgrade memory, and accessing the downgrade memory with specific commands, the downgrade memory can be accessed by a host, thus, downgrade memory is still acceptable as a usable memory. The method is applied in a downgrade memory including a plurality of blocks, each block having a plurality of pages, and each page having a plurality of sectors, the downgrade memory having a plurality of non-accessible sectors. The method comprises the steps of: parsing a write command corresponding to a special block having at least one of the non-accessible sectors; selecting at least one accessible sector according to status information of the special block; and programming the write command to the accessible sectors. The status information indicates at least one of the non-accessible sectors.

Yet a further aspect of this invention is to provide a downgrade memory apparatus. The downgrade memory apparatus comprises at least one management unit and a controller. The management unit comprises a plurality of blocks, each block having a plurality of pages, and each page having a plurality of sectors. The sectors of the downgrade memory comprise a plurality of accessible sectors and a plurality of non-accessible sectors. The controller is configured to parse a write command corresponding to a special block, in which the special block has at least one of the non-accessible sectors. The controller is configured to select accessible sectors according to generate status information by programming an initial read command to the blocks, and mark at least one block as the special block in response to the status information; wherein the status information indicates at least one of the non-accessible sectors of the at least one block.

The present invention makes the downgrade memory with non-accessible sectors available. Also, the present invention avoids abandoning downgrade memory and reduces cost.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

Hereinafter, exemplary embodiments of the present invention will be described in detail with reference to the attached drawings.

In the descriptions that follow, the present invention will be described in reference to embodiments that mark bad sectors of a downgrade memory and access the downgrade memory with specific commands to make the downgrade memory able to be accessed by a host, thus, the downgrade memory is still acceptable as a usable memory. However, embodiments of the invention are not limited to any particular environment, application or implementation. Therefore, the descriptions of the embodiments that follow are for purposes of illustration and not limitation.

Figure 1:
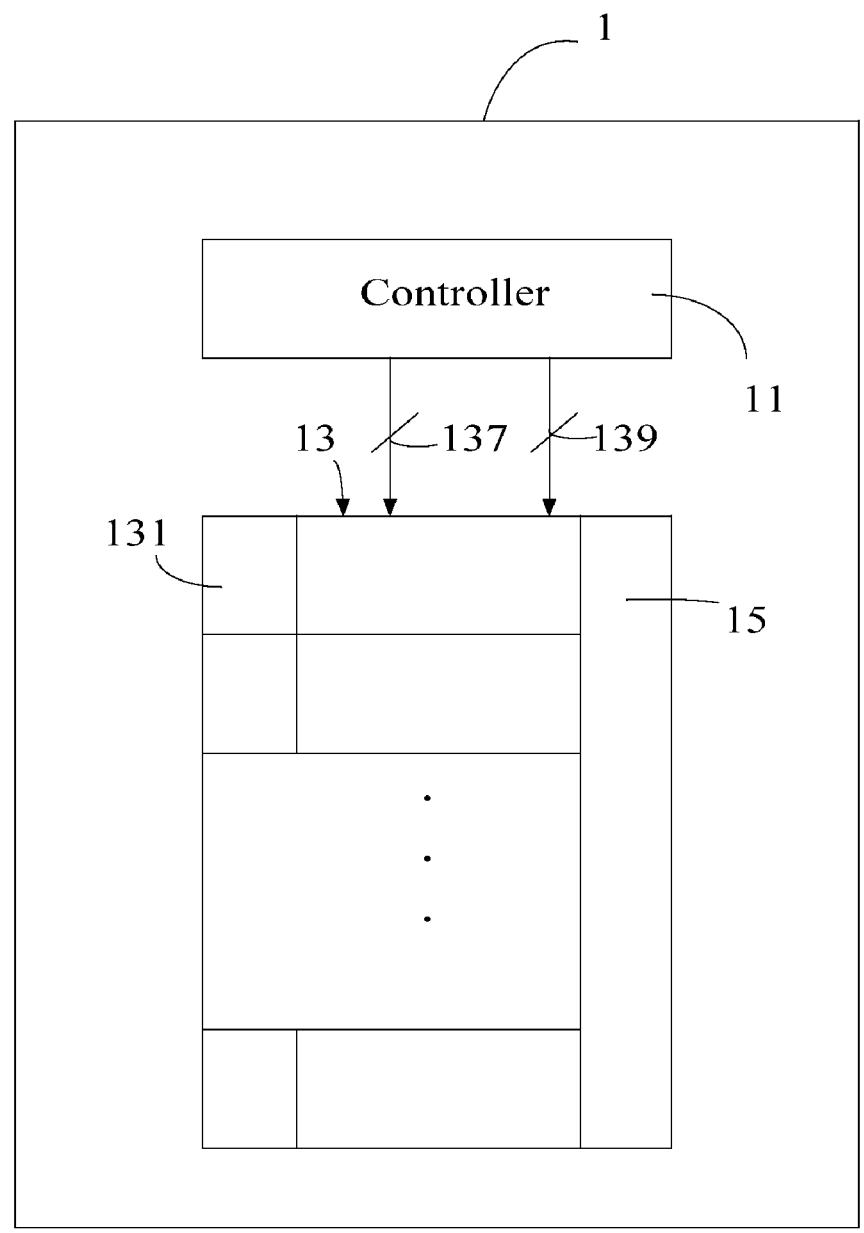
FIG. 1 illustrates a block diagram of a downgrade memory apparatus of the present invention.
Figure 2:
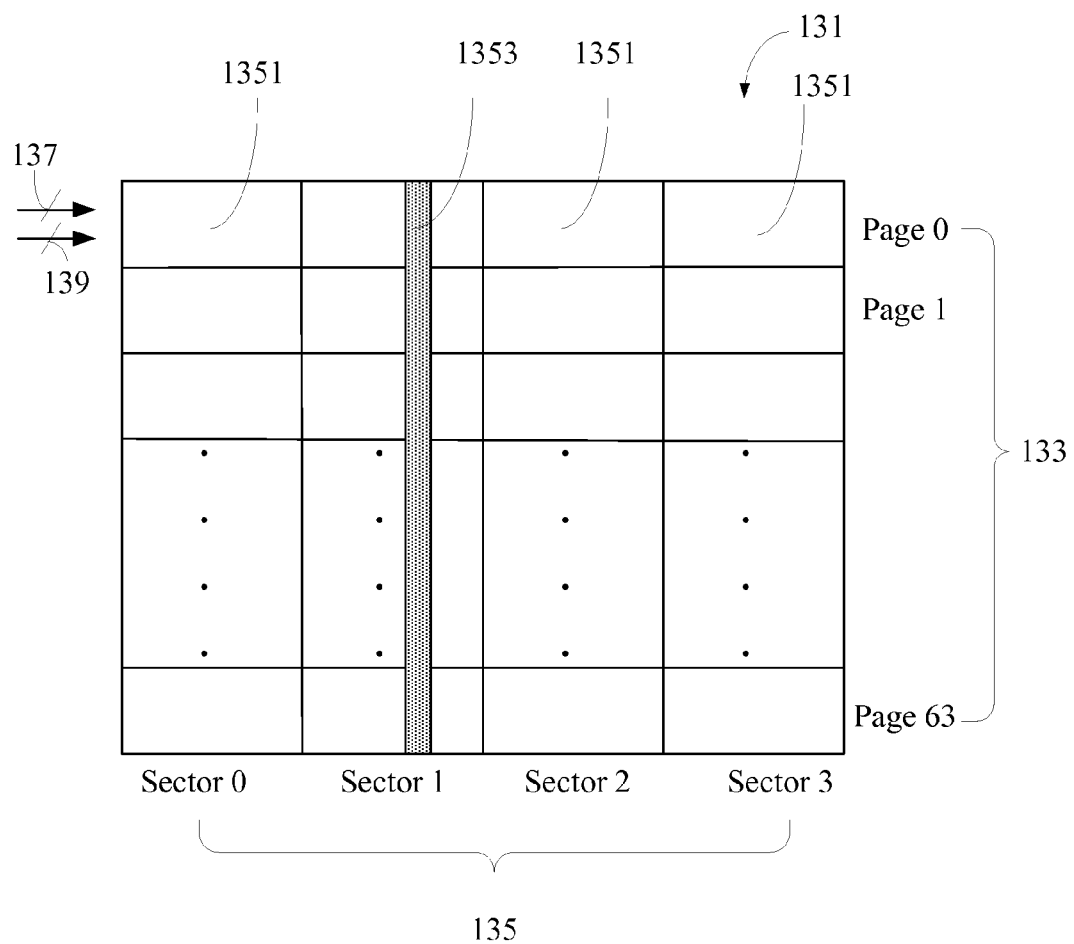
FIG. 2 illustrates a schematic diagram of one block of the downgrade memory apparatus.

FIG. 1 illustrates a block diagram of a downgrade memory apparatus 1 of the present invention. The downgrade memory apparatus 1 comprises a controller 11, at least one management unit 13, and a look-up table 15. The management unit 13 comprises a plurality of blocks, and FIG. 2 illustrates a schematic diagram of one block 131 of the downgrade memory apparatus 1. The block 131 has a plurality of pages 133, and each page 133 has a plurality of sectors 135. In other embodiments, the downgrade memory may comprise a plurality of blocks but the blocks are not divided into management units. That is, the management unit is substantially designed to divide blocks into groups for convenient management, as the literal meaning, and is not intended to limit the present invention.

The controller 11 is connected to the management unit 13 and the look-up table 15. To further explain operation of the controller 11, the block 131 is taken as an example. Please also refer to FIG. 2, in which the block 131 has sixty-four pages, and each page has four sectors. The controller 11 is configured to program an initial write command 137 to each sector in the block 131. The initial write command 137 is executed to write every sector of each page. More specifically, the initial write command 137 comprises a predetermined pattern, and the predetermined pattern includes data assigned to be written to each of the pages. Then, the controller 11 is configured to program an initial read command 139 to read the sectors that have been written by the initial write command 137, and to generate status information by comparing the predetermined pattern with read status of sectors in response to the initial read command 139. The status information indicates bad sectors and/or qualified sectors, i.e. non-accessible sectors 1353 and/or accessible sectors 1351, and the controller 11 then marks at least one block 131 as a special block having at least one of the non-accessible sectors 1353 in response to the status information. Additionally, the status information indicates the at least one of the non-accessible sectors of the at least one block. Then the controller 11 stores the status information into the look-up table 15. It should be noted that, preferred condition of the special block only has a non-accessible sector.

In this embodiment, the downgrade memory apparatus 1 is assumed to have non-accessible sectors 1353 located in sector 1 of each page. That is, the block 131 includes a plurality of accessible sectors 1351 and a plurality of non-accessible sectors 1353. It is easy to understand that once there are too many non-accessible sectors indicated by the status information, the downgrade memory apparatus 1 may be sifted out from qualified products. The ratio of non-accessible sectors 1353 for determining qualified product is not a limitation of the present invention.

After the controller 11 has executed the initial write command 137 and the initial read command 139, the controller 11 can know well distribution of accessible sectors 1351 by retrieving the status information. For example, the status information is denoted as (1, 0, 1, 1) which comprises four bits to indicate status of four sectors, and (1, 0, 1, 1) indicates the sector 1 is a non-accessible sector 1353 and the other sectors 1351 are accessible sectors in the special block. When the controller 11 operates to write data into the downgrade memory apparatus 1, the controller 11 parses a write command corresponding to the at least one special block, then selects accessible sectors 1351 according to the status information, and programs the write command to write the accessible sectors 1351 being selected in the special block. Alternatively, the controller 11 could select accessible sectors 1351 according to the status information of the special block first, and then parse a write command corresponding to the at least one special block, and program the write command to the accessible sectors 1351 being selected in the special block. As for description of the write command, please refer to the following description.

Figure 3:
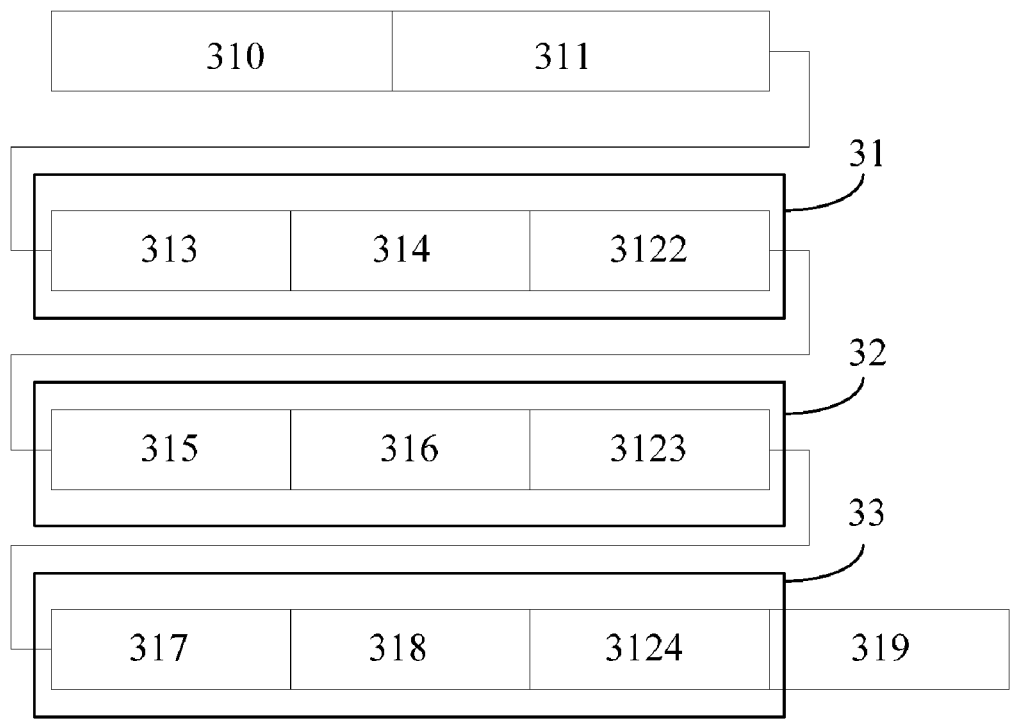
FIG. 3 illustrates an example of the write command for the downgrade memory apparatus.

FIG. 3 illustrates an example of the write command for the downgrade memory apparatus 1. Generally, the write command comprises a head portion 310, a first addressing portion 311, at least one list portion, and a tail portion 319. In this example, the at least one list portion includes a first list portion 31, a second list portion 32, and a third list portion 33. The first list portion 31 orderly comprises a linking portion 313, a second portion 314, and a data portion 3122. The second list portion 32 orderly comprises a linking portion 315, a second portion 316, and a data portion 3123. The third list portion 33 orderly comprises a linking portion 317, a second portion 318, and a data portion 3124.

The head portion 310 indicates the beginning of the write command. The first addressing portion 311 next to the head portion 310 indicates page address for being written with data. The first list portion 31 is adjacent to the first addressing portion. The second list portion 32 is adjacent to the first list portion 31. The third list portion 33 is adjacent to the second list portion 32. The tail portion 319 next to the third list portion 33 indicates end of the written command. The aforementioned list portions 31, 32, 33 generally carry sector address and data. Accordingly, the linking portions 313, 315, 317 are adapted to enable a random data input process for accessing sectors randomly. The second addressing portions 314, 316, 318 indicate sector address for being written with data. The data portions 3122, 3123, and 3124 are used for grouping the data. In this embodiment, the linking portion 313 of the first list portion 31 is adjacent to the first addressing portion 311; the linking portion 315 of the second list portion 32 is adjacent to the data portion 3122 of the first list portion 31; the linking portion 317 of the third list portion 33 is adjacent to the data portion 3124 of the second list portion 32. Finally, the tail portion 319 is adjacent to the data portion 3124 of the third list portion 33.

In the downgrade memory apparatus 1, sector 1 of each page is determined as the non-accessible sectors 1353, therefore, each page only has three accessible sectors 1351, as shown in FIG. 2. FIG. 3 illustrates the written command carrying data that would occupy three sectors. Since the written is executed with the downgrade memory apparatus 1, the controller 11 has to insert linking portion 313, 315, and 317 into the written command. The controller 11 first parses the data carried in the written command, and determines that one page is needed for the data of the written command. Then the controller 11 selects three accessible sectors of the page. In this example, the controller 11 sequentially selects accessible sectors from the first page (ex. page 0). Then the controller 11 distributes the written command into four parts linking each other by the linking portions 313, 315, and 317. Each linking portion 313, 315, and 317 is coupled with the second addressing portion 314, 316, and 318 respectively indicating accessible sectors of the page 0, and each of the second addressing portions 314, 316, and 318 is coupled with the data portion 3122, 3123, and 3124 respectively. The end portion 319 is coupled to the last data portion 3124.

Then, the controller 11 programs the written command illustrated in FIG. 3 and writes the data into one page of the downgrade memory apparatus 1. For different memory standards, the first addressing portion 311 is adjacent to the head portion 310 of the write command may contain different contains. In this embodiment, the head portion 310 is a serial data input command defined as 80$h$, the linking portions 313, 315 and 317 are a random data input command defined as 85h, and the tail portion 319 is a page program confirm command defined as 10h, wherein 80h, 85h, and 10h are industrial standards and widely accepted by memory manufacturers.

Figure 4:
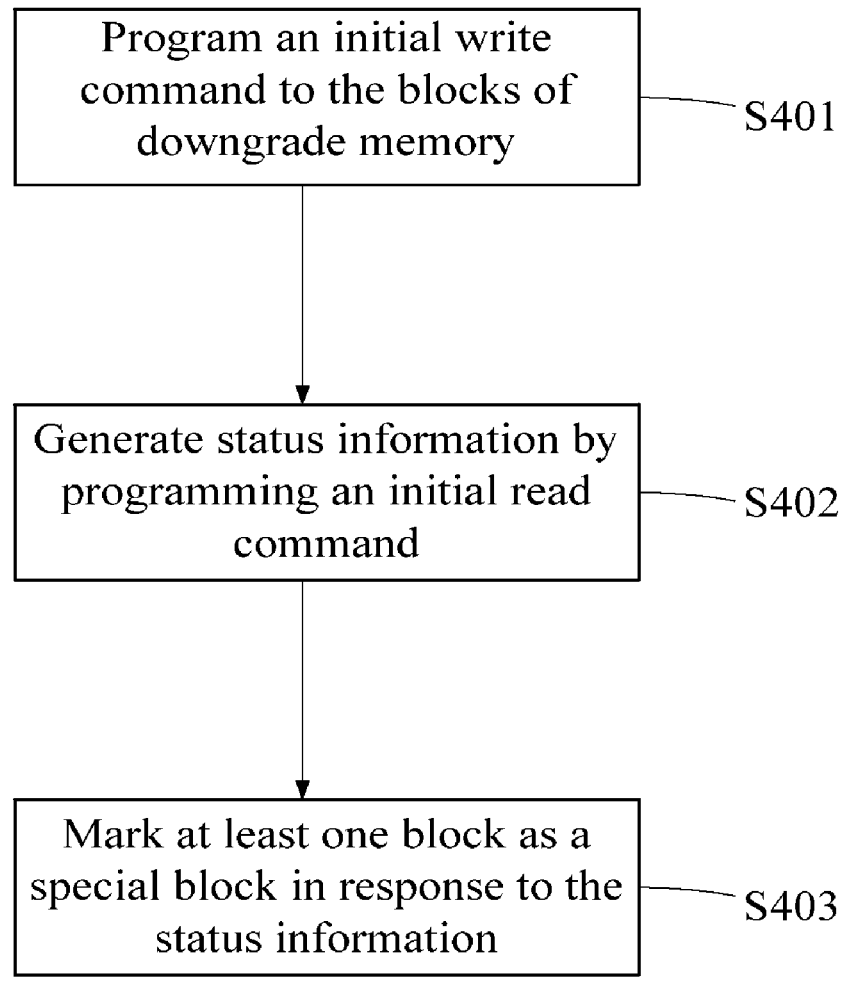
FIG. 4 illustrates another embodiment of the present invention, which is a flow chart of a method for accessing a downgrade memory.

FIG. 4 illustrates another embodiment of the present invention, which is a flow chart of a method for accessing a downgrade memory. The paragraphs that follow explain operation of the downgrade memory apparatus 1 and the method illustrated in FIG. 4.

At first, Step 401 is executed to program an initial write command to the blocks of the downgrade memory apparatus 1. More specifically, the initial write command comprises a predetermined pattern, and the predetermined pattern includes data assigned to be written to each of the blocks. Then, Step 402 is executed to generate status information by programming an initial read command to the blocks after the blocks have been written. More particularly, the Step 402 is executed to generate a read status in response to the initial read command, and compare the read status with the predetermined pattern to generate the status information. When there is any mismatch between the read status and the predetermined pattern, the status information would indicate the mismatch, representing that there is non-accessible sectors in the downgrade memory apparatus 1. Then Step 403 is executed to mark at least one block having at least one of the non-accessible sectors in response to the status information, and the downgrade memory apparatus 1 is able for further accessing.

Figure 5:
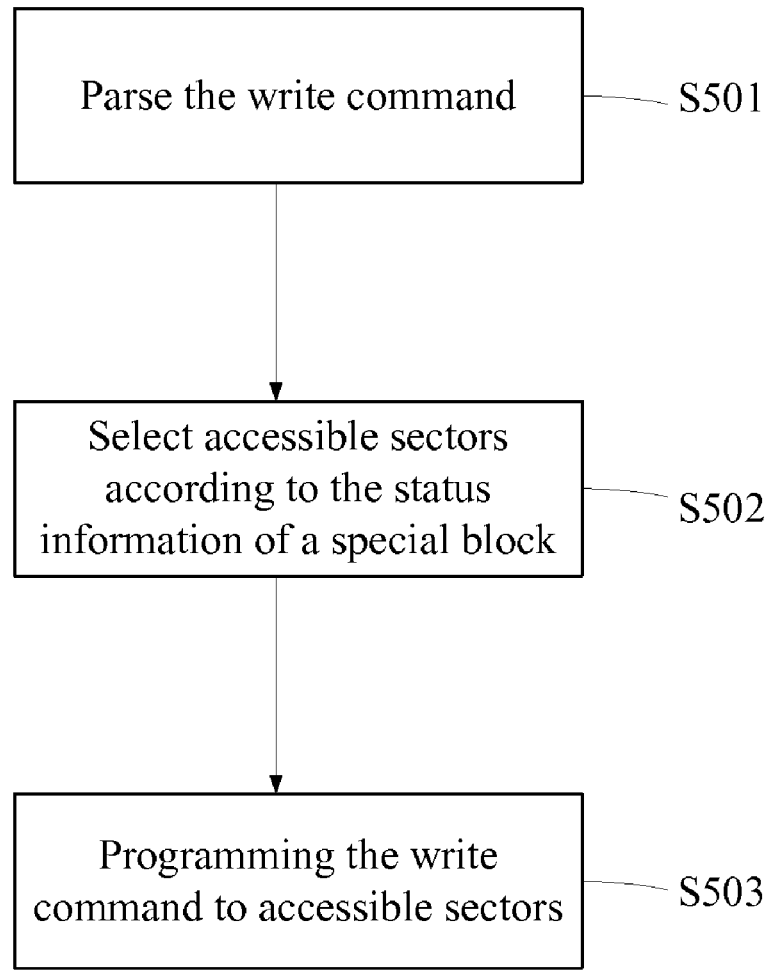
FIG. 5 illustrates a flow chart of operation of the downgrade memory when a write command is received by the downgrade memory from a host, after the downgrade memory is able for further accessing.

FIG. 5 illustrates a flow chart of operation of the downgrade memory apparatus 1 when a write command is received by the downgrade memory apparatus 1 from a host, after the downgrade memory apparatus 1 is able for further accessing. First, Step 501 is executed to parse the write command corresponding to a special block having at least one of the non-accessible sectors. Then Step 502 is executed to select accessible sectors according to the status information of the special block. Then Step 503 is executed to program the write command to the accessible sectors.

The above disclosures are related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A method for accessing a downgrade memory including a plurality of blocks, each block having a plurality of pages, and each page having a plurality of sectors, the downgrade memory having a plurality of non-accessible sectors, the method comprising the steps of:
   programming an initial write command to the blocks;
   generating status information by programming an initial read command to the blocks after the blocks have been written;
   marking at least one block as a special block having at least one of the non-accessible sectors in response to the status information for a follow-up accessing, wherein the status information indicates the at least one of the non-accessible sectors of the at least one block;
   parsing a write command corresponding to the at least one special block;
   selecting accessible sectors according to the status information; and
   programming the write command to the accessible sectors, wherein the write command comprises:
      a head portion, indicating the beginning of the write command;
      a first addressing portion next to the head portion, indicating page address for being written with data;
      at least one list portion, being adjacent to the first addressing portion; and
      a tail portion next to the at least one list portion, indicating end of the write command, wherein each of the at least one list portion stores sector address and data.

2. The method of claim 1, wherein each of the at least one list portion orderly comprises:
   a linking portion, being adapted to enable a random data input process for accessing sectors randomly;
   a second addressing portion next to the linking portion, indicating sector address for being written with data; and
   a data portion next to the second addressing portion, being used for grouping the data.

3. The method of claim 1, wherein the step of generating status information comprising:
   generating a read status in response to the initial read command; and
   comparing the read status with a predetermined pattern to generate the status information.

4. The method of claim 3, wherein the initial write command comprises the predetermined pattern, and the predetermined pattern includes data assigned to be written to each of the plurality of blocks.

5. A method for accessing a downgrade memory including a plurality of blocks, each block having a plurality of pages, and each page having a plurality of sectors, the downgrade memory having a plurality of non-accessible sectors, the method comprising the steps of:
   parsing a write command corresponding to a special block having at least one of the non-accessible sectors;
   selecting accessible sectors according to status information of the special block; and
   programming the write command to the accessible sectors, wherein the status information indicates at least one of the non-accessible sectors of the blocks, wherein the write command comprises:
      a head portion, indicating the beginning of the write command;
      a first addressing portion next to the head portion, indicating page address for being written with data;
      at least one list portion, being adjacent to the first addressing portion; and
      a tail portion next to the at least one list portion, indicating end of the write command, wherein each of the at least one list portion stores sector address and data.

6. The method of claim 5, wherein each of the at least one list portion orderly comprises:
   a linking portion, being adapted to enable a random data input process for accessing sectors randomly;
   a second addressing portion next to the linking portion, indicating sector address for being written with data; and
   a data portion next to the second addressing portion, being used for grouping the data.

7. A downgrade memory apparatus, comprising:
   at least one management unit, comprising a plurality of blocks, each block having a plurality of pages, and each page having a plurality of sectors, wherein the sectors of the downgrade memory comprise a plurality of accessible sectors and a plurality of non-accessible sectors; and a controller, being configured to:
   generate status information by programming an initial read command to the blocks;
   mark at least one block as a special block having at least one of the non-accessible sectors in response to the status information, wherein the status information indicates at least one of the non-accessible sectors of the blocks
   parse a write command corresponding to the special block;
   select the accessible sectors according to the write command; and
   program the write command to the accessible sectors being selected, wherein the write command comprises:
      a head portion, indicating the beginning of the write command;
      a first addressing portion next to the head portion, indicating page address for being written with data;
      at least one list portion, being adjacent to the first addressing portion; and
      a tail portion next to the at least one list portion, indicating end of the write command, wherein each of the at least one list portion stores sector address and data.

8. The downgrade memory apparatus of claim 7, wherein each of the at least one list portion orderly comprises:
   a linking portion, being adapted to enable a random data input process for accessing sectors randomly;
   a second addressing portion next to the linking portion, indicating sector address for being written with data; and
   a data portion next to the second addressing portion, being used for grouping the data.

9. The downgrade memory apparatus of claim 7, the downgrade memory apparatus further comprising a look-up table, wherein the controller stores the status information into the look-up table.

10. The downgrade memory apparatus of claim 7, wherein the controller is further configured to program an initial write command to the blocks before generating the status information, to generate the status information by programming an initial read command to the blocks after the blocks have been written and to mark at least one non-accessible sector of each block as the special block in response to the status information.

11. The downgrade memory apparatus of claim 10, wherein the initial write command comprises a predetermined pattern, and the predetermined pattern includes data assigned to be written to each of the plurality of blocks.

* * * * *